United States Patent
Liu et al.

(10) Patent No.: US 8,609,460 B2
(45) Date of Patent: Dec. 17, 2013

(54) SEMICONDUCTOR STRUCTURE AND FABRICATING METHOD THEREOF

(75) Inventors: Po-Tsun Liu, Hsinchu (TW); Yi-Teh Chou, Taipei (TW); Li-Feng Teng, Taoyuan County (TW); Fu-Hai Li, Hsinchu (TW); Han-Ping D. Shieh, Hsinchu (TW); Wei-Ting Lin, Taipei County (TW); Ming-Chin Hung, Nantou County (TW); Chun-Ching Hsiao, Taipei County (TW); Jiun-Jye Chang, Hsinchu (TW); Po-Lun Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 283 days.

(21) Appl. No.: 13/089,282

(22) Filed: Apr. 18, 2011

(65) Prior Publication Data
US 2012/0061661 A1    Mar. 15, 2012

(30) Foreign Application Priority Data
Sep. 13, 2010    (TW) .............................. 99130916 A

(51) Int. Cl.
| H01L 21/00 | (2006.01) |
| H01L 21/16 | (2006.01) |
| H01L 29/10 | (2006.01) |
| H01L 29/12 | (2006.01) |
| H01L 29/786 | (2006.01) |

(52) U.S. Cl.
USPC ...................... 438/104; 257/43; 257/E29.296

(58) Field of Classification Search
USPC .............. 257/E29.296, 43, E21.411; 438/104
See application file for complete search history.

(56) References Cited

U.S. PATENT DOCUMENTS

| 7,368,067 | B2* | 5/2008 | Yata et al. ..................... 252/500 |
| 7,569,284 | B2* | 8/2009 | Shero et al. .................. 428/610 |
| 8,349,669 | B2* | 1/2013 | Ye .................................. 438/151 |
| 2009/0008639 | A1 | 1/2009 | Akimoto et al. |
| 2010/0102311 | A1 | 4/2010 | Ito et al. |
| 2010/0252832 | A1* | 10/2010 | Asano et al. ..................... 257/57 |
| 2011/0180802 | A1 | 7/2011 | Morosawa et al. |
| 2012/0090664 | A1* | 4/2012 | Yamaguchi et al. .......... 136/249 |
| 2012/0241709 | A1* | 9/2012 | Tsuji ................................ 257/2 |

FOREIGN PATENT DOCUMENTS

| CN | 1906527 A | 1/2007 |
| CN | 101393861 A | 3/2009 |
| TW | 201025614 | 7/2010 |
| WO | 2009136645 | 11/2009 |

OTHER PUBLICATIONS

"First Office Action of China Counterpart Application", issued on Aug. 15, 2011, p. 1-p. 3.

(Continued)

*Primary Examiner* — Phat X Cao
*Assistant Examiner* — Diana C Vieira
(74) *Attorney, Agent, or Firm* — Jianq Chyun IP Office

(57) ABSTRACT

A semiconductor structure and a fabricating method thereof are provided. The fabricating method includes forming a gate, a source, and a drain on a substrate and forming an oxide semiconductor material between the gate and the source and drain. The oxide semiconductor material is formed by performing a deposition process, and nitrogen gas is introduced before the deposition process is completely performed, so as to form oxide semiconductor nitride on the oxide semiconductor material.

8 Claims, 3 Drawing Sheets

(56) References Cited

OTHER PUBLICATIONS

Kim et al. "High Performance Oxide Thin Film Transistors with Double Active Layers," IEEE, 2008, p. 73-p. 76.

Ye et al. "High mobility amorphous zinc oxynitride semiconductor material for thin film transistors," Journal of Applied Physics, 2009, p. 074512-1-p. 074512-8.

"Office Action of Taiwan Counterpart Application", issued on Apr. 15, 2013, p. 1-p. 4.

* cited by examiner

US 8,609,460 B2

SEMICONDUCTOR STRUCTURE AND FABRICATING METHOD THEREOF

CROSS-REFERENCE TO RELATED APPLICATION

This application claims the priority benefit of Taiwan application serial no. 99130916, filed Sep. 13, 2010. The entirety of the above-mentioned patent application is hereby incorporated by reference herein and made a part of this specification.

BACKGROUND OF THE INVENTION

1. Field of the Invention

The present invention relates to a semiconductor structure. More particularly, the present invention relates to a thin film transistor (TFT) having an oxide semiconductor material.

2. Description of Related Art

By virtue of the rising awareness of environmental protection, flat panel displays featuring superior properties including low power consumption, optimal space utilization, no radiation, and high definition have gradually become the mainstream products in the market of the displays. Common flat panel displays include liquid crystal displays (LCDs), plasma displays, organic electroluminescent displays, and so forth. The prevailing LCD is mainly comprised of a thin film transistor (TFT) array substrate, a color filter substrate, and a liquid crystal layer sandwiched between the two substrates, for instance. Amorphous silicon (a-Si) TFTs or low temperature polysilicon TFTs on a conventional TFT array substrate often serve as switch elements of sub-pixels. According to the recent researches, the oxide semiconductor TFT, in comparison with the a-Si TFT, is characterized by favorable carrier mobility and, in comparison with the low temperature polysilicon TFT, is characterized by desired threshold voltage ($V_{th}$) uniformity. Hence, an oxide semiconductor TFT has the potential to be the key element in the next generation flat panel display.

However, under the atmospheric environment, the oxide semiconductor material is apt to be affected by moisture and oxygen, such that electrical properties of the oxide semiconductor material are varied together with time. As such, electrical performance and reliability of the oxide semiconductor TFT are deteriorated.

SUMMARY OF THE INVENTION

The present invention is directed to a semiconductor structure capable of improving electrical performance and reliability of an oxide semiconductor TFT.

The present invention provides a semiconductor structure that includes a gate, a source, a drain, an oxide semiconductor material, and an oxide semiconductor nitride. The oxide semiconductor material is located between the gate and the source and drain. The oxide semiconductor nitride covers the oxide semiconductor material.

The present invention further provides a fabricating method of a semiconductor structure. The fabricating method includes forming a gate, a source, and a drain on a substrate and forming an oxide semiconductor material between the gate and the source and drain. The oxide semiconductor material is formed by performing a deposition process, and nitrogen gas is introduced before the deposition process is completely performed, so as to form oxide semiconductor nitride above the oxide semiconductor material.

Based on the above, the oxide semiconductor nitride is formed on the oxide semiconductor material by consecutive deposition according to the present invention, and thereby the oxide semiconductor material can be protected by the oxide semiconductor nitride and is not affected by oxygen and moisture under the atmospheric environment. That is to say, the oxide semiconductor nitride acts as the protection layer of the oxide semiconductor material, such that the semiconductor structure of which the oxide semiconductor material has the protection layer can have favorable reliability.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1A:
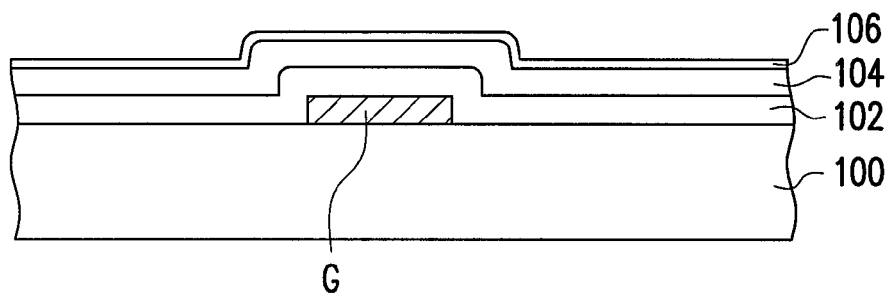
FIG. 1A to FIG. 1C are schematic cross-sectional views illustrating a fabricating process of a semiconductor structure according to an embodiment of the present invention.
Figure 1B:
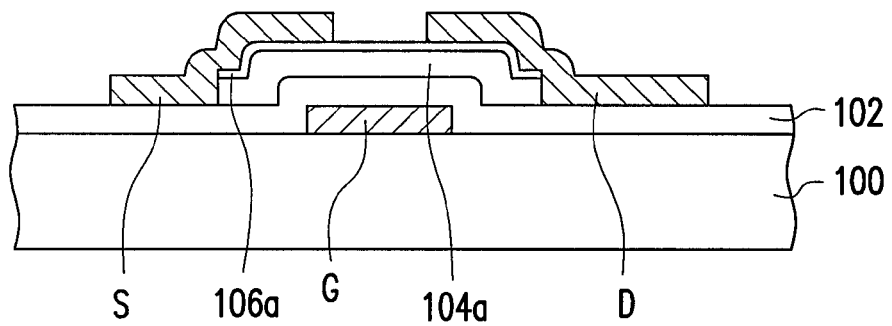
Figure 1C:
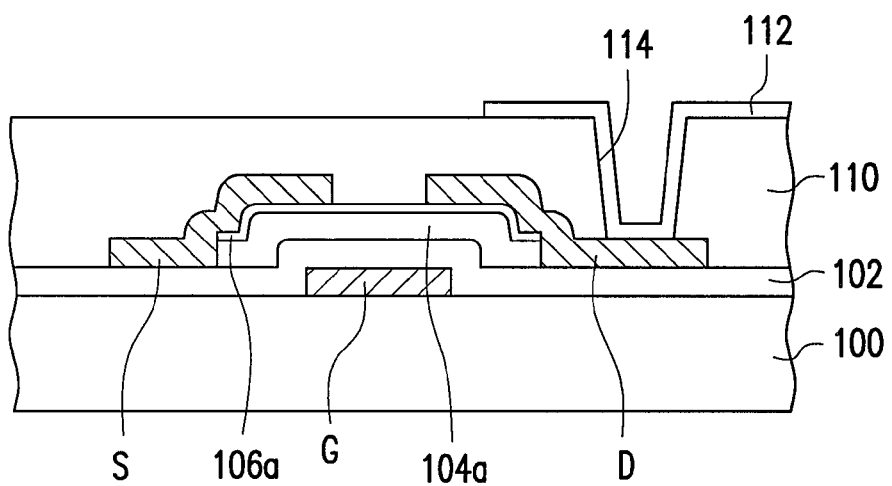

FIG. 1A to FIG. 1C are schematic cross-sectional views illustrating a fabricating process of a semiconductor structure according to an embodiment of the present invention. With reference to FIG. 1A, a substrate 100 is provided. The substrate 100 can be made of glass, quartz, organic polymer, a non-light-transmissive/reflective material (such as a conductive material, metal, wafer, ceramics, or any other appropriate material), or any other appropriate material. According to an embodiment of the present invention, an insulating layer (not shown) acting as a buffer layer can be further formed on the surface of the substrate 100.

A gate G is formed on the substrate 100. In an embodiment of the present invention, the gate G is formed by depositing a conductive layer (not shown) and then patterning the conductive layer by performing a photolithography and etching process, for instance. Meanwhile, a scan line (not shown) electrically connected to the gate G can also be defined. In consideration of electrical conductivity, the gate G is often made of a metallic material. However, the gate G can also be made of other conductive materials in other embodiments, which should not be construed as a limitation to the present invention. The metallic material is, for example, an alloy, metal nitride, metal oxide, metal oxynitride, another appropriate material, or a layer in which the metallic material and any other conductive material are stacked to each other.

An insulating layer 102 is formed on the substrate 100 to cover the gate G. The insulating layer 102 herein can be referred to as a gate insulating layer, and a material of the insulating layer 102 includes an inorganic material (e.g., silicon oxide, silicon nitride, silicon oxynitride, any other suitable material, or a layer in which at least two of the above materials are stacked together), an organic material, any other appropriate material, or a combination of the above.

The oxide semiconductor material 104 and the oxide semiconductor nitride 106 are consecutively formed on the insulating layer 102. In this embodiment, the oxide semiconductor material 104 and the oxide semiconductor nitride 106 are formed by consecutive deposition, for instance. To be more specific, the oxide semiconductor material 104 and the oxide semiconductor nitride 106 are formed by moving the substrate 100 into a deposition chamber and performing a deposition process to deposit the oxide semiconductor material 104 on the insulating layer 102 of the substrate 100. Before the deposition process is completely performed, nitrogen gas is introduced, so as to form the oxide semiconductor nitride 106 on the oxide semiconductor material 104. The deposition process can be the chemical vapor deposition process or the physical vapor deposition process. In other words, introduce nitrogen gas before the step of forming the oxide semiconductor material 104 is completely performed, so as to form an oxide semiconductor nitride 106 on the oxide semiconductor material 104.

In an embodiment of the present invention, manufacturing parameters of the deposition process are exemplarily provided below: power is 100 W, deposition time (depo. time) is 5 minutes (mins), and a flow rate of argon (Ar) is 10 sccm. Besides, the nitrogen gas introduced before the deposition process is completely performed has the flow rate of about 2 sccm, for instance.

The oxide semiconductor nitride 106 mainly serves as the protection layer of the oxide semiconductor material 104, such that the oxide semiconductor material 104 can be protected from being exposed to the atmosphere. The oxide semiconductor nitride 106 has a thickness that is great enough to completely cover the oxide semiconductor material 104. Hence, the thickness of the oxide semiconductor nitride 106 in this embodiment is about 50 nm, and the thickness of the oxide semiconductor material 104 is about 50 nm, for example. According to other embodiments of the present invention, the thickness of the oxide semiconductor nitride 106 can also be less than the thickness of the oxide semiconductor material 104.

According to this embodiment, the oxide semiconductor material 104 includes indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO). The oxide semiconductor nitride 106 includes indium-gallium-zinc oxide nitride (IGZON), zinc oxide nitride (ZnON), tin oxide nitride (SnON), indium-zinc oxide nitride (IZON), gallium-zinc oxide nitride (GZON), zinc-tin oxide nitride (ZTON), or indium-tin oxide nitride (ITON). It should be mentioned that the oxide semiconductor nitride 106 is formed by introducing nitrogen gas before the deposition process is completely performed on the oxide semiconductor material 104. Hence, the oxide semiconductor in both the oxide semiconductor nitride 106 and the oxide semiconductor material 104 are made of the same material. Given the oxide semiconductor material 104 includes IGZO, the oxide semiconductor nitride 106 includes IGZON.

Note that the oxide semiconductor nitride 106 and the oxide semiconductor material 104 can be formed in the same deposition chamber, for instance, and therefore the oxide semiconductor nitride 106 and the oxide semiconductor material 104 can be formed by in-situ deposition or consecutive deposition. Here, the oxide semiconductor nitride 106 and the oxide semiconductor material 104 are formed by in-situ deposition or consecutive deposition, i.e., the substrate 100 does not leave the deposition chamber when the oxide semiconductor nitride 106 and the oxide semiconductor material 104 are formed on the substrate 100. Hence, the oxide semiconductor material 104 is constantly covered by the oxide semiconductor nitride 106 and is not exposed to the atmosphere. Since the oxide semiconductor material 104 is protected by the oxide semiconductor nitride 106, the oxide semiconductor material 104 is not affected by the moisture and oxygen under the atmospheric environment and can have favorable electrical performance.

The oxide semiconductor nitride 106 and the oxide semiconductor material 104 are patterned to form the oxide semiconductor nitride 106a and the oxide semiconductor material 104a that have island-like patterns, as shown in FIG. 1B. In this embodiment, the oxide semiconductor nitride 106 and the oxide semiconductor material 104 are patterned by performing a photolithography and etching process, for instance. Since the oxide semiconductor nitride 106 and the oxide semiconductor material 104 are patterned at the same time, the patterned oxide semiconductor nitride 106a and the patterned oxide semiconductor material 104a have the same patterns.

The source S and the drain D are then formed on the oxide semiconductor nitride 106a. In an embodiment of the present invention, the source S and the drain D are formed by depositing a conductive layer (not shown) and then patterning the conductive layer by performing a photolithography and etching process, for instance. Additionally, when the source S and the drain D are formed, the data line (not shown) electrically connected to the source S can be also defined. In consideration of electrical conductivity, the source S and the drain D are often made of a metallic material. However, the source S and the drain D can also be made of other conductive materials in other embodiments, which should not be construed as a limitation to the present invention. The metallic material is, for example, an alloy, metal nitride, metal oxide, metal oxynitride, another appropriate material, or a layer in which the metallic material and any other conductive material are stacked to each other.

After the step depicted in FIG. 1B is performed, the semiconductor structure formed thereby is referred to as the TFT. The TFT includes the gate G, the source S, the drain D, the oxide semiconductor material 104a, and the oxide semiconductor nitride 106a. The oxide semiconductor material 104a is located between the gate G and the source S and drain D. The oxide semiconductor nitride 106a covers the oxide semiconductor material 104a. According to an embodiment of the present invention, the insulating layer 102 further covers the gate G.

In the TFT, the oxide semiconductor material 104a serves as the active layer of the TFT, and the oxide semiconductor nitride 106a serves as the protection layer of the oxide semiconductor material 104a. The oxide semiconductor material 104a is protected by the oxide semiconductor nitride 106a, and therefore the oxide semiconductor material 104a is not exposed to the atmosphere. As such, the oxide semiconductor material 104a can have favorable electrical performance.

The TFT can serve as a switch element of any electronic device. For instance, the TFT can act as the switch element of the pixel structure in the display, which is described below.

With reference to FIG. 1C, after the TFT is completely formed, an insulating layer 110 can be further formed on the substrate 100, and the insulating layer 110 covers the source S and the drain D of the TFT. A material of the insulating layer 110 includes an inorganic material (e.g., silicon oxide, silicon nitride, silicon oxynitride, any other suitable material, or a layer of which at least two of the above materials are stacked together), an organic material (e.g., polyester (PET), polyethylene, cycloolefin, polyimide, polyamide, polyalcohols, polyphenylene, polyether, polyketone, any other suitable material, or a combination thereof), any other suitable material, or a combination of the above.

A contact opening 114 is formed in the insulating layer 110, and the drain D is exposed. The contact opening 114 is formed by performing a photolithography process or by performing a photolithography and etching process, for instance.

A pixel electrode 112 is formed on the insulating layer 110, and the pixel electrode 112 is electrically connected to the drain D through the contact opening 114. The pixel electrode 112 can be a transmissive pixel electrode, a reflective pixel electrode, or a transflective pixel electrode. A material of the transmissive pixel electrode includes metal oxide, such as ITO, IZO, aluminum tin oxide (ATO), aluminum zinc oxide (AZO), IGZO, other suitable oxide, or a layer in which at least two of the above materials are stacked together. A material of the reflective pixel electrode includes a metallic material with high reflectivity.

In this embodiment, relevant manufacturing parameters of each device are listed below, which should however not be construed as limitations to the present invention:

| IGZO | |
|---|---|
| pre-sputter | 5 min |
| sputter | 3.25 min |
| thickness | 50 nm |
| Power DC | 100 W |
| Ar flow rate | 10 sccm |

| IGZON | |
|---|---|
| pre-sputter | 5 min |
| sputter | 5.25 min |
| thickness | 50 nm |
| power DC | 100 W |
| Ar flow rate | 10 sccm |
| $N_2$ flow rate | 2 sccm |

| ITO | |
|---|---|
| pre-sputter | 5 min |
| sputter | 17 min |
| thickness | 100 nm |
| power RF | 80 W |
| Ar flow rate | 10 sccm | pressure in chamber when plasma is generated: 20 mTorr
pressure in chamber during deposition: 5 mTorr
ratio of N, In, Ga, Zn, and O analyzed by Rutherford Backscattering Spectrometry (RBS) analyzer: In:Ga:Zn:O:N = 1:1.1:0.8:5.4:1.7

After the step depicted in FIG. 1C is completely performed, the semiconductor structure formed thereby includes a TFT and a pixel electrode 112. The TFT includes the gate G, the source S, the drain D, the oxide semiconductor material 104a, and the oxide semiconductor nitride 106a. The oxide semiconductor material 104a is located between the gate G and the source S and drain D. The oxide semiconductor nitride 106a covers the oxide semiconductor material 104a. The pixel electrode 112 is electrically connected to the drain D. According to an embodiment of the present invention, the insulating layer 102 further covers the gate G. The insulating layer 110 is further disposed between the pixel electrode 112 and the TFT. In this embodiment, the pixel electrode 112 and the drain D are electrically connected through the contact opening 114.

In the TFT of the pixel structure described above, the oxide semiconductor material 104a serves as the active layer and is protected by the oxide semiconductor nitride 106a, such that the oxide semiconductor material 104a is not exposed to the atmosphere. Hence, the TFT having the oxide semiconductor material 104a and the oxide semiconductor nitride 106a is characterized by favorable electrical performance. Thereby, the pixel structure of which the TFT serves as the switch element can have desired reliability.

The TFT described in the above embodiment is a bottom-gate TFT, for instance. However, the present invention is not limited thereto. In other embodiments of the present invention, the structure of which the oxide semiconductor material 104a acts as the active layer and the oxide semiconductor nitride 106a serves as the protection layer can also be applied to a top-gate TFT.

Figure 2:
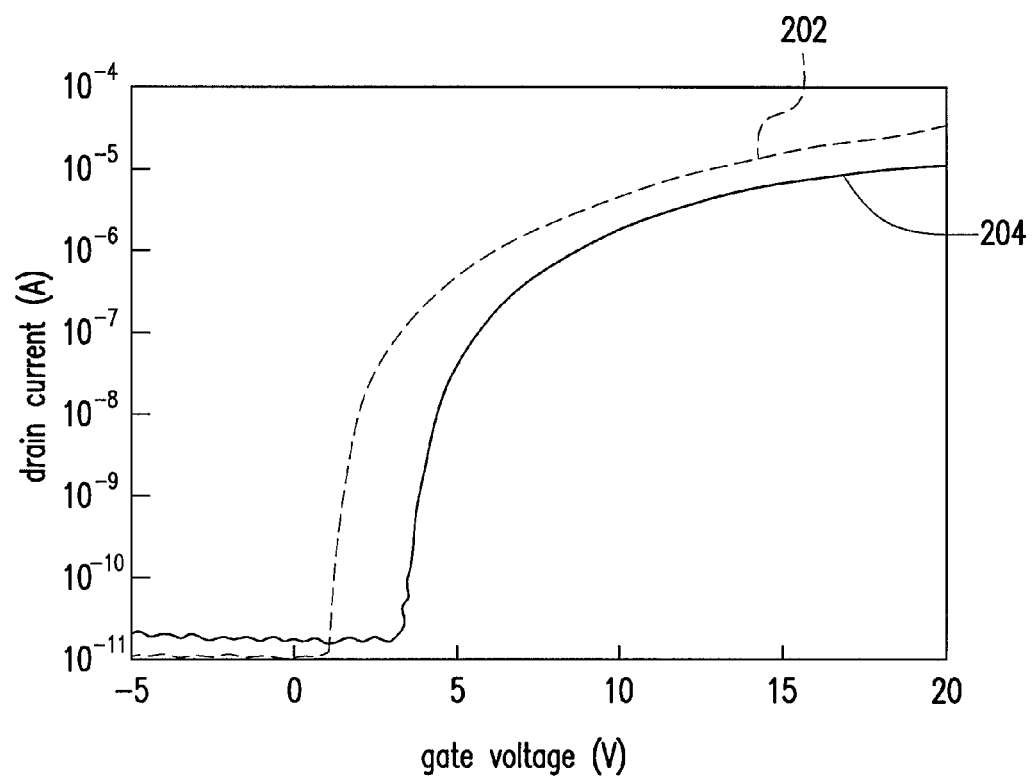
FIG. 2 illustrates the correlation between a drain current and a gate voltage of a TFT.

FIG. 2 illustrates the correlation between a drain current and a gate voltage of a TFT. With reference to FIG. 2, the horizontal axis stands for the gate voltage, and the vertical axis stands for the drain current. The curve 202 indicates the correlation between the drain current and the gate voltage of a TFT, and the TFT has the IGZO active layer and the IGZON protection layer. Namely, the IGZON protection layer covers the IGZO active layer of the TFT. The curve 204 indicates the correlation between the drain current and the gate voltage of a TFT, and the TFT has the IGZO active layer. Namely, the IGZO active layer of the TFT is not protected by the IGZON protection layer.

It can be learned from FIG. 2 that the TFT having the IGZO active layer and the IGZON protection layer (shown by the curve 202), in comparison with the TFT having the IGZO active layer but not the IGZON protection layer (shown by the curve 204), has a relatively high drain current even though the gate voltage is relatively low. As such, it can be ensured the TFT having the IGZO active layer and the IGZON protection layer is characterized by favorable electrical performance.

Figure 3:
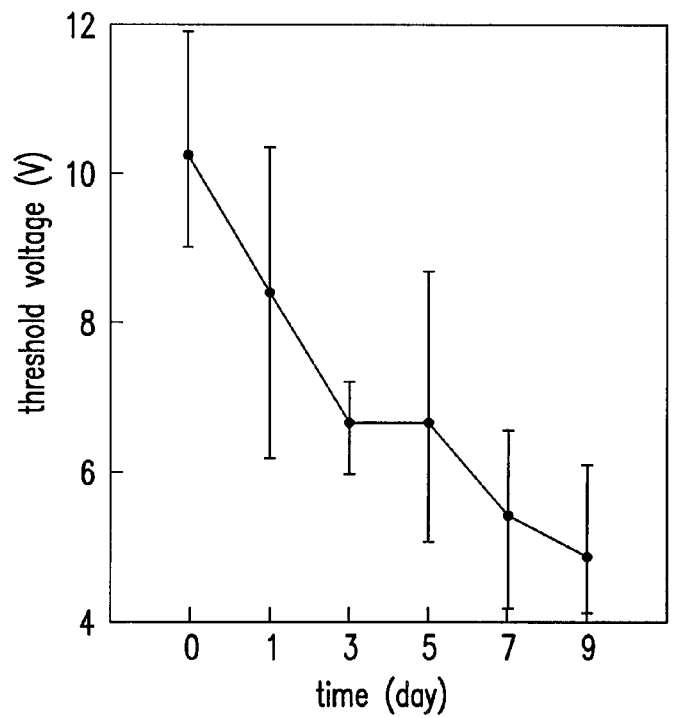
FIG. 3 and FIG. 4 illustrate the correlation between a threshold voltage and time of a TFT.
Figure 4:
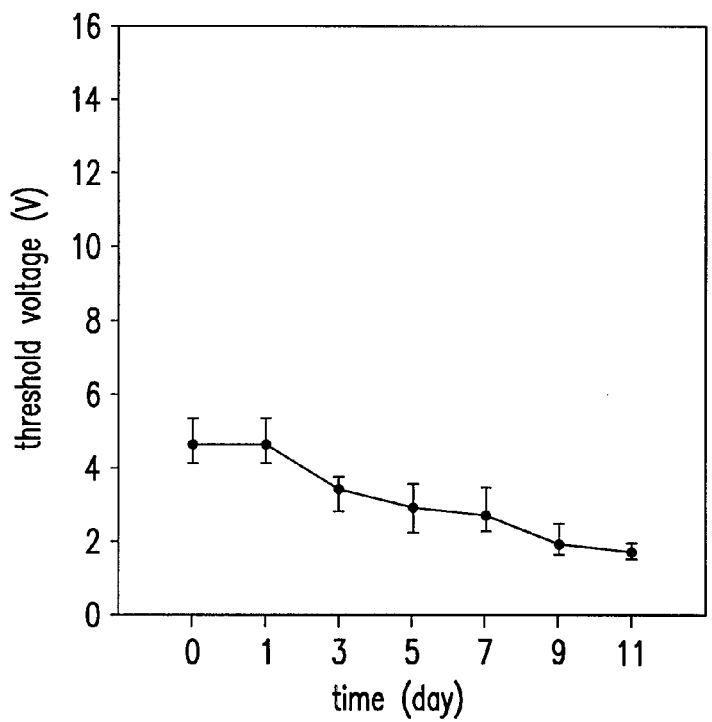

FIG. 3 and FIG. 4 illustrate the correlation between a threshold voltage and time of a TFT. In FIG. 3 and FIG. 4, the horizontal axis stands for the time, and the vertical axis stands for the threshold voltage. FIG. 3 shows the curve that indicates the correlation between the threshold voltage and time of the TFT, and the TFT has the IGZO active layer. Namely, the IGZO active layer of the TFT is not protected by the IGZON protection layer. FIG. 4 shows the curve that indicates the correlation between the threshold voltage and time of the TFT, and the TFT has the IGZO active layer and the IGZON protection layer. Namely, the IGZON protection layer covers the IGZO active layer of the TFT.

It is apparently shown in FIG. 3 and FIG. 4 that stability and uniformity of the threshold voltage of the TFT as depicted in FIG. 3 are not satisfactory. By contrast, stability and uniformity of the threshold voltage of the TFT as depicted in FIG. 4 are favorable. As such, it can be ensured the TFT having the IGZO active layer and the IGZON protection layer (as indicated in FIG. 4) is characterized by favorable electrical performance.

In light of the foregoing, the oxide semiconductor nitride is formed on the oxide semiconductor material by consecutive deposition according to the present invention, and thereby the oxide semiconductor material can be protected by the oxide semiconductor nitride from being affected by oxygen and moisture under the atmospheric environment. That is to say, the oxide semiconductor nitride protects the oxide semiconductor material, and thereby the oxide semiconductor material can have favorable electrical performance and reliability. As such, the TFT and/or the semiconductor structure in which the oxide semiconductor material has the protection layer can have favorable reliability.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. A fabricating method of a semiconductor structure, comprising:
   forming a gate, a source, and a drain on a substrate; and
   performing a single deposition process to form an oxide semiconductor material and an oxide semiconductor nitride between the gate and the source and drain,
   wherein nitrogen gas is introduced before the single deposition process is completely performed, so as to form the oxide semiconductor nitride on the oxide semiconductor material.

2. The fabricating method as claimed in claim 1, wherein the nitride gas introduced in the single deposition process has a flow rate of about 2 sccm, a thickness of the oxide semiconductor nitride is about 50 nm, and a thickness of the oxide semiconductor material is about 50 nm.

3. The fabricating method as claimed in claim 1, wherein the oxide semiconductor material comprises indium-gallium-zinc oxide, zinc oxide, tin oxide, indium-zinc oxide, gallium-zinc oxide, zinc-tin oxide, or indium-tin oxide, and the oxide semiconductor nitride comprises indium-gallium-zinc oxide nitride, zinc oxide nitride, tin oxide nitride, indium-zinc oxide nitride, gallium-zinc oxide nitride, zinc-tin oxide nitride, or indium-tin oxide nitride.

4. The fabricating method as claimed in claim 1, further comprising forming a pixel electrode, the pixel electrode being electrically connected to the drain.

5. A fabricating method of a semiconductor structure, comprising:
   forming a gate, a source, and a drain on a substrate;
   forming an oxide semiconductor material and an oxide semiconductor nitride between the gate and the source and drain;
   wherein nitrogen gas is introduced before the step of forming the oxide semiconductor material is completely performed, so as to form the oxide semiconductor nitride on the oxide semiconductor material.

6. The fabricating method as claimed in claim 5, wherein the introduced nitride gas has a flow rate of about 2 sccm, a thickness of the oxide semiconductor nitride is about 50 nm, and a thickness of the oxide semiconductor material is about 50 nm.

7. The fabricating method as claimed in claim 5, wherein the oxide semiconductor material comprises indium-gallium-zinc oxide, zinc oxide, tin oxide, indium-zinc oxide, gallium-zinc oxide, zinc-tin oxide, or indium-tin oxide, and the oxide semiconductor nitride comprises indium-gallium-zinc oxide nitride, zinc oxide nitride, tin oxide nitride, indium-zinc oxide nitride, gallium-zinc oxide nitride, zinc-tin oxide nitride, or indium-tin oxide nitride.

8. The fabricating method as claimed in claim 5, further comprising forming a pixel electrode, the pixel electrode being electrically connected to the drain.

* * * * *